United States Patent [19]

Maari

[11] Patent Number: 5,510,283
[45] Date of Patent: Apr. 23, 1996

[54] METHOD OF MAKING A SEMICONDUCTOR DEVICE

[75] Inventor: Koichi Maari, Kanagawa, Japan

[73] Assignee: Sony Corporation, Tokyo, Japan

[21] Appl. No.: 327,718

[22] Filed: Oct. 24, 1994

[30] Foreign Application Priority Data

Oct. 28, 1993 [JP] Japan .................................. 5-294065

[51] Int. Cl.$^6$ .............................................. H01L 21/8247
[52] U.S. Cl. .................. 437/43; 437/52; 437/70; 437/170
[58] Field of Search ................... 437/43, 48, 52, 437/170, 70; 257/315

[56] References Cited

U.S. PATENT DOCUMENTS

| | | | |
|---|---|---|---|
| 4,426,764 | 1/1984 | Kosa et al. | 437/43 |
| 4,642,881 | 2/1987 | Matsukawa et al. | 437/43 |
| 5,110,753 | 5/1992 | Gill et al. | 437/43 |
| 5,120,571 | 6/1992 | Gill et al. | 437/43 |
| 5,296,396 | 3/1994 | Bellezza | 437/43 |

OTHER PUBLICATIONS

Wolf, Silicon Processing for the VLSI ERA vol. 2, Lattice Press, pp. 20–25.

*Primary Examiner*—Tom Thomas
*Attorney, Agent, or Firm*—Hill, Steadman & Simpson

[57] ABSTRACT

A semiconductor device includes a semiconductor substrate, element isolation films, channel stop diffusion layers, and elements formed on the semiconductor substrate in spaced-apart relation from each other by means of the element isolation films. The element has a floating gate. The element isolation film has such a film thickness of <t> that the conducting type of a portion of the semiconductor substrate under the element isolation film, which is disposed at a position where a control gate is formed on the upper surface of the element isolation film by way of the floating gate, is not inverted, and that the conducting type of a portion of the semiconductor substrate under the element isolation film, which is disposed at a position where the control gate is directly formed on the upper surface of the element isolation film, is inverted. With this arrangement, the elements are separated from each other by each element isolation film having a thinner thickness of <t>.

5 Claims, 4 Drawing Sheets

5,510,283

METHOD OF MAKING A SEMICONDUCTOR DEVICE

BACKGROUND OF THE INVENTION

The present invention relates to a semiconductor device and a method of forming the same, and particularly to a semiconductor device formed with elements having floating gates and a method of forming the same.

In a semiconductor device with a plurality of elements formed on a semiconductor substrate, there are formed element isolation films and channel stop diffusion layers for electrically separating the elements from each other.

For example, as shown in FIG. 5, a semiconductor device formed with elements having floating gates includes a semiconductor substrate 30, each element isolation film 31, each channel stop diffusion layer 32 and elements 33. The element isolation film 31, being made of an oxide film, is formed on the semiconductor substrate 30. The channel stop diffusion layer 32 is formed along the lower surface of the element isolation film 31 by diffusion of conductive impurities in the semiconductor substrate 30. The elements 33 are formed on regions separated from each other by means of each element isolation film 31 and each channel diffusion layer 32. The element 33 is thus constituted of a portion of the semiconductor substrate 30 in spaced-apart relation from each other by the element isolation film 30, a gate insulating film 301 formed on the semiconductor substrate 30, and a conductive layer 302 formed on the gate insulating layer 301. The conductive layer 302 includes a floating gate 303 and a control gate 305. The floating gate 303 is disposed on the upper surface of the gate insulating film 301 such that both the ends thereof are overlapped on the edge portions of the adjacent element isolation films 31. The surface of the floating gate 303 is covered with an insulating film 304. The control gate 305 is disposed on the insulating film 304 and on the element isolation film 31.

In the semiconductor device 3 formed with the elements 33 having the floating gates 303, electric charge is injected or discharged to or from each floating gate 303 for writing or erasing information to or from each element 33. In this case, each control gate 305 is possibly applied with a high voltage of about 20 V. The element isolation film 31 and the channel stop diffusion layer 32 thus require an element separating ability for preventing the formation of a parasitic MOS between the element 33a (33) and 33b (33) even when the voltage of 20 V is applied to the control gate 305. The element isolation ability is dependent on the film thickness of the element isolation film 31 and the impurity concentration in the channel stop diffusion layer 32.

For this reason, in the semiconductor device 3, the film thickness of the element isolation film 31 and the impurity concentration in the channel stop diffusion layer 32 are determined such that the conducting type of a portion of the semiconductor substrate 30 positioned under the element isolation film 31 is not inverted even when the above-described high voltage is applied to the control gate 305.

Another example of the semiconductor device formed with elements having floating gates is shown in FIG. 6. In this semiconductor device 4, the channel stop diffusion layer in the semiconductor device shown in FIG. 5 is of a two-layer structure of a first channel stop diffusion layer 42 and a second channel stop diffusion layer 43. The first channel stop diffusion layer 42 is formed along the lower surface of an element isolation film 41 formed on a semiconductor substrate 40. The second channel stop diffusion layer 43 is formed under the element isolation film 41 at a position where a control gate 403 is directly disposed on the upper surface of the element isolation film 41. The second channel stop diffusion layer 43 is denser in the diffused impurity concentration than the first channel stop diffusion layer 42.

In the semiconductor device 4, the film thickness of the element isolation film 41 and the diffused ion concentrations of the first and second channel stop diffusion layers 42 and 43 are determined such that at least the conducting type of a portion of the semiconductor substrate 40 corresponding to the second channel stop diffusion layer 43 is not inverted.

The element isolation film, however, tends to be thinned with the recent advance in the fining of the semiconductor device. Accordingly, to positively separate the elements 33a (33) and 33b (33) from each other in the semiconductor device 3 shown in FIG. 5, it is required to increase the diffused impurity concentration of the channel stop diffusion layer 32. However, the increase in the concentration of the channel diffusion layer 32 causes an inconvenience in that the withstand voltage of a diffusion layer (not shown) formed on the semiconductor substrate 30 for forming the element 33 is reduced at the edge portions of the element isolation film 31. Thus, the increase in the diffused[ impurity concentration of the channel stop diffusion layer 32 has a limitation, and therefore, to keep the element isolation ability to some extent, the film thickness of the element isolation film 31 must be kept to be thick somewhat. This obstructs the fining of the semiconductor device.

In the semiconductor device 4 having the construction shown in FIG. 6, the second channel stop diffusion layer positively separates the elements 44a (44) and 44b (44) from each other, and the reduction in the withstand voltage of a diffusion layer (not shown) for forming the element 44 is prevented by suppressing the diffused ion concentration of the first channel stop diffusion layer 42 positioned at the edge portions of the element isolation film 41. Accordingly, as compared with the film thickness of the element isolation film of the semiconductor device having the single channel stop diffusion layer, the film thickness of the element isolation film 41 can be reduced.

However, in the formation of the semiconductor device 4, there are required two steps of ion implantation for forming the first and second channel stop diffusion layers 42 and 43, thereby complicating the forming process compared with the formation of the semiconductor device 3 shown in FIG. 3.

SUMMARY OF THE INVENTION

An object of the present invention is to provide a semiconductor device capable of solving the above-described problem, and to fine the structure of a semiconductor device without increasing the number of the processes of forming the semiconductor device.

To achieve the above object, according to a first aspect of the present invention, there is provided a semiconductor device including:

a semiconductor substrate;

element: isolation films formed on the semiconductor substrate;

channel stop diffusion layers formed in the semiconductor substrate along the lower surfaces of the element isolation films for preventing the inversion of the channels in element isolation regions; and a plurality of elements separated from each other by means of the element isolation films, each of the elements including: source and drain regions formed on each surface portion of the semiconductor substrate in spaced-apart relation from each other to define a channel region therebetween; a gate insulating film formed on the channel region; a floating gate disposed on the gate insulating film such that both ends thereof are overlapped on the end portions of the element isolation film; an insulating film formed to cover the floating gate; and a control gate disposed on the insulating film and on the element isolation film;

wherein a portion of the semiconductor substrate under the element isolation film has a first region disposed at a position where the control gate is directly formed on the upper surface of the element isolation film, and a second region disposed at a position where the control gate is formed on the upper surface of the element isolation film by way of the floating gate, and wherein the conducting type of the first region is inverted and the conducting type of the second region is not inverted.

The above first and second regions are preferably adjusted in the inversion of the conducting type by the film thickness of the element isolation films and/or the impurity concentration in the channel stop diffusion layer.

The above element isolation film preferably has a thickness ranging from 350 to 600 nm.

The above channel stop diffusion layer preferably contains impurities in a concentration ranging from $3 \times 10^{12}$ cm$^2$ to $7 \times 10^{13}$/cm$^2$.

To achieve the above object, according to a second aspect of the present invention, there is provided a method of manufacturing a semiconductor device having a plurality of elements, each of the elements including: source and drain regions formed on each surface portion of the semiconductor substrate in spaced-apart relation from each other to define a channel region therebetween; a gate insulating film formed on the channel region; a floating gate disposed on the gate insulating film such that both ends thereof are overlapped on the end portions of the element isolation film; an insulating film formed to cover the floating gate; and a control gate disposed on the insulating film and on the element isolation film, the method including:

a first process of forming an oxidization preventive film on the semiconductor substrate, and forming an opening portion in the oxidization preventive film;

a second process of forming an element isolation film on a portion of the semiconductor substrate which is exposed from the opening portion of the oxidization preventive film, and also forming a channel stop diffusion layer in the semiconductor substrate along the lower surface of the element isolation film; and a third process of forming the element on each portion of the semiconductor substrate in spaced-apart relation from each other by means of the element isolation film and the channel stop diffusion layer.

The above element isolation film preferably has a thickness ranging from 350 to 600 nm.

The above channel stop diffusion layer preferably contains impurities in a concentration ranging from $3 \times 10^{12}$/cm$^1$ to $7 \times 10^{13}$/cm$^2$.

In the above semiconductor device, the element isolation film has such a thickness that the conducting type of a portion of the semiconductor substrate under the element isolation film, which is disposed at a position where the control gate is formed on the upper surface of the element isolation film by way of the floating gate, is not inverted. Accordingly, the elements having the floating gates are electrically separated from each other.

Moreover, the element isolation film has such a thickness <t> that a portion of the semiconductor substrate under the element isolation film, which is disposed at the position where the control gate is directly formed on the upper surface of the element isolation film, is inverted. Accordingly, assuming that the diffused ion concentration of the channel stop diffusion layer is made constant, the above elements are separated from each other by means of the element isolation film having a film thickness being thinner than that of the element isolation film not permitting the inversion of the conducting type of a portion of the semiconductor substrate under the element isolation film which is disposed at the position where the control gate is formed.

Additionally, by the above-described method of forming a semiconductor device, a channel stop diffusion layer can be formed by only one step of ion implantation.

DETAILED DESCRIPTION OF THE PREFERRED EMBODIMENTS

Hereinafter, an embodiment of the present invention will be described with reference to the drawings.

Figure 1:
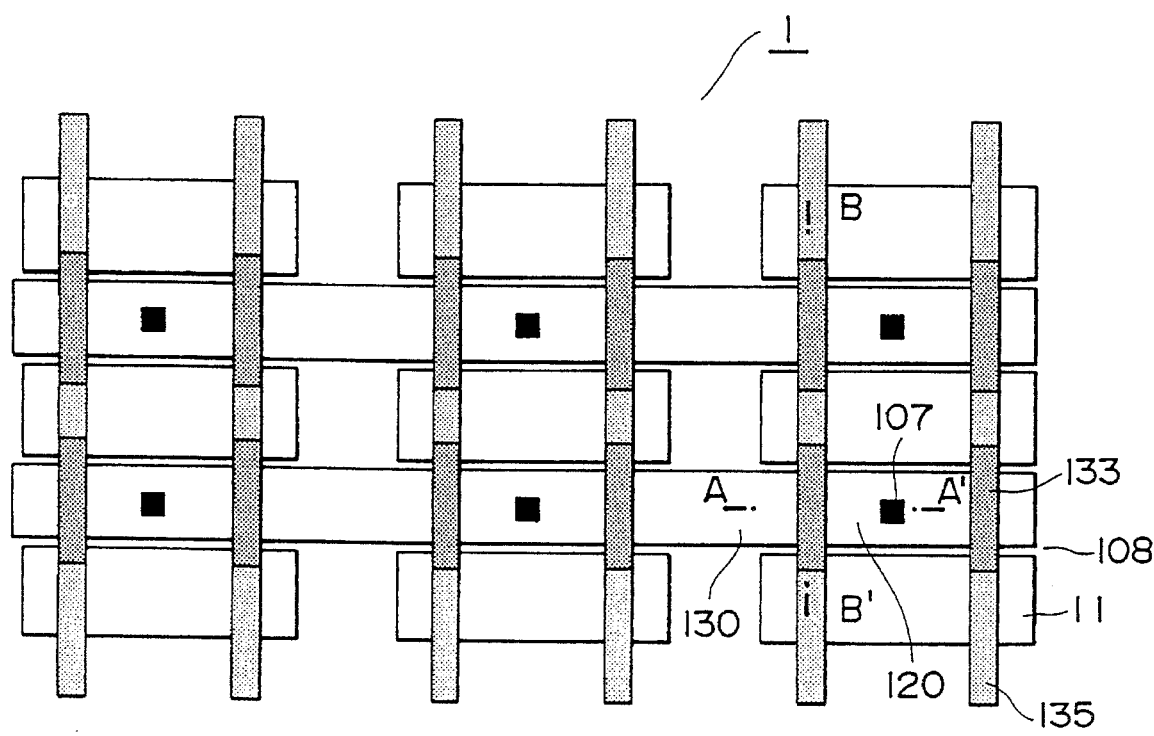
FIG. 1 is a plan view of a semiconductor device.
Figure 2:
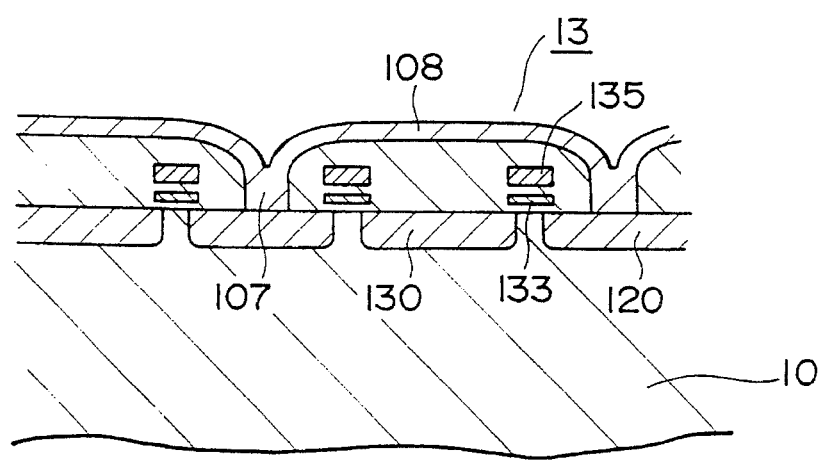
FIG. 2 is a sectional view taken on line A—A' of the semiconductor device shown in FIG. 1.

FIG. 1 is a plan view of a semiconductor device 1 of a transistor array. In the semiconductor device 1, a plurality of elements 13, and element isolation films 11 and channel stop diffusion layers 12 for separating the elements 13 from each other are formed on a semiconductor substrate 10 (see FIGS. 2 and 3). In this figure, reference numeral 108 designates an interconnect layer; 120 is a drain region; 130 is a source region; 133 is a floating gate; and 135 is a control gate. Reference numeral 107 designates a contact portion between the drain region 120 and the interconnect layer 108. The elements are separated from each other by means of the element separating LOCOS films 11. FIG. 2 is a sectional view taken on line A—A' of FIG. 1. As shown in FIG. 2, the source region 130 and the drain region 120 are formed on the surface portion of the semiconductor substrate 10. A channel region is formed between the source region and the drain region. The floating gate 133 is layered on the channel region by way of a gate insulating film 131, and the control gate is layered on the floating gate 133 by way of an insulating film 134 (see FIG. 3).

Figure 3:
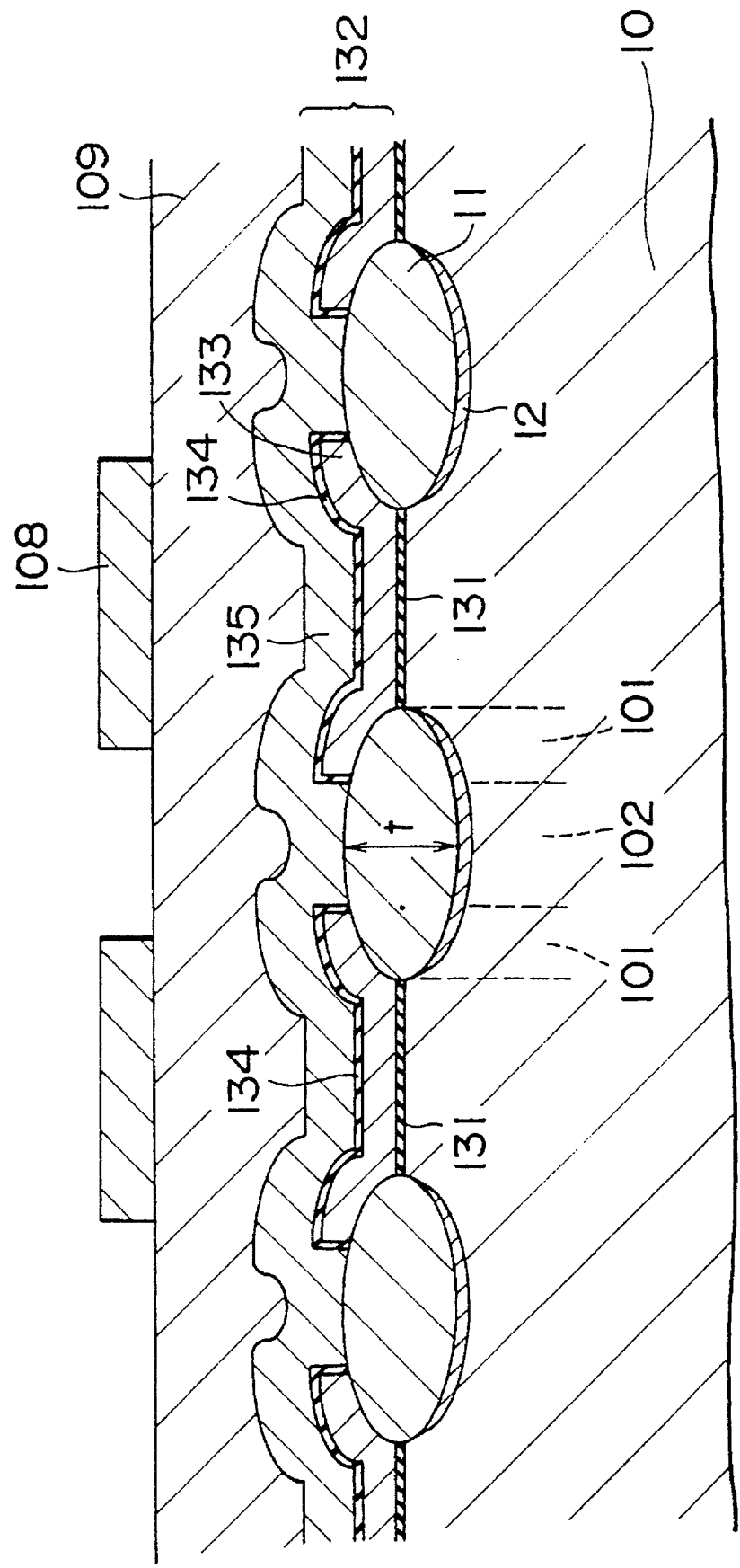
FIG. 3 is a sectional view of line B—B' of the semiconductor device shown in FIG. 1.

FIG. 3 is a sectional view of line B—B' of FIG. 1. A metal interconnect 108 is formed on an interlayer insulating film 109. The channel stop diffusion layer 12 is formed on the lower portion of the element isolation film 11 for preventing the inversion of the channel thereby preventing the inversion of the element isolation region. As shown in FIG. 3, the semiconductor substrate 10 has a first region 102 at a position where the control gate 135 is directly formed on the upper surface of the element isolation film 11, and a second region 101 at a position where the control gate 135 is formed on the upper surface of the element isolation film 11 by way of the floating gate 133.

In this embodiment, the element isolation film 11 is made of an oxide film having a thickness of <t>, and which is formed over the surface of the semiconductor substrate 10 expect for the portions on which the elements should be formed.

The channel stop diffusion layer 12 is formed by diffusion of ions implanted in the semiconductor substrate 10, and which is disposed in the semiconductor substrate 10 along the lower surface of the element isolation film 11. The diffused impurity concentration in the channel stop diffusion layer 12 is determined so as not to reduce the withstand voltage of a diffusion layer forming the element 13.

The element 13 having a floating gate includes a portion of semiconductor substrate 10 in spaced-apart relation from each other by means of the element isolation film 11, the gate insulating film formed on the upper surface of the semiconductor substrate 10, and a conductive layer 132 formed on the gate insulating film 131. The conductive layer 132 includes the floating gate 133 and the control gate 135. The floating gate 133 is disposed on the upper surface of the gate insulating film 131 such that both the ends thereof are overlapped on the edge portions of the element isolation film 11, and which is covered with the insulating film 134. The control gate 135 is disposed on the insulating film 134 and on the element isolation film 11 so as to cover the element 13.

The film thickness of <t> of the element isolation film 11 is determined such that, in the semiconductor substrate 10 under the element isolation film 11, the conducting type of the region 101, which is disposed at the position where the control gate 135 is formed on the upper surface of the element isolation film 11 by way of the floating gate 133, is not inverted. Moreover, the film thickness of <t> of the element isolation film 11 is determined such that, in the semiconductor 10 under the element isolation film 11, the conducting type of the region 102, which is disposed at the position where the control gate 135 is directly formed on the upper surface of the element isolation film 11, is inverted.

In general, in such a state that electrons are not injected in the floating gate 133, the potential of the floating gate 133 is in the order of 60% of the potential applied to the control gate 135. Accordingly, the film thickness <t> of the element isolation film 11 is determined such that the conducting type of the region 101 of the semiconductor substrate 10 is not inverted by the potential being about 60% of that applied to the control gate 135, and that the conducting type of the region 102 of the semiconductor substrate 10 is inverted by the potential being the same as that applied to the control gate 135.

For example, in the case where a voltage of about 20 V is applied to the control gate, and the amount of the ions implanted in the channel stop diffusion layer 12 is about $7 \times 10^{13}$ pieces/cm², the film thickness <t> of the element isolation film 11 is set at about 400 nm.

In the semiconductor device 1 formed in the manner described above, the element isolation film 11 has such a thickness <t> that a portion of the semiconductor substrate 10 under the element isolation film 11, which is disposed at the position where the control gate 135 is formed on the upper surface of the element isolation film 11 by way of the floating gate 133, is not inverted. Thus, when the semiconductor device 1 is operated, there is not generated any parasitic MOS between the elements 13, thereby sufficiently separating the elements 13 from each other.

Moreover, the element isolation film 11 has such a thickness <t> that a portion of the semiconductor substrate 10 under the element isolation film 11, which is disposed at the position where the control gate 135 is directly formed on the upper surface of the element isolation film 11, is inverted. Accordingly, assuming that the diffused ion concentration of the channel stop diffusion layer 12 is made constant, the above elements are separated from each other by means of the element isolation film 11 having a film thickness being thinner than that of the element isolation film not permitting the inversion of the conducting type of a portion of the semiconductor substrate under the element isolation film which is disposed at the position where the control gate is formed.

Next, a method for forming the above-described semiconductor device will be described with reference to FIGS. 4A to 4D.

Figure 4A:
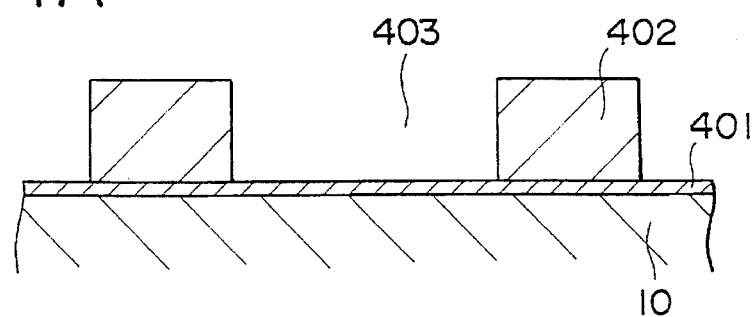
FIGS. 4A to 4D are sectional views showing the processes of manufacturing the semiconductor device.

First, in a first process shown in FIG. 4A, a pad oxide film 401 was formed on the surface of the semiconductor substrate 10, and an oxidization preventive film 402 was formed on the upper surface of the pad oxide film 401. An opening portion 403 was then formed in the oxidization preventive film 402.

Figure 4B:
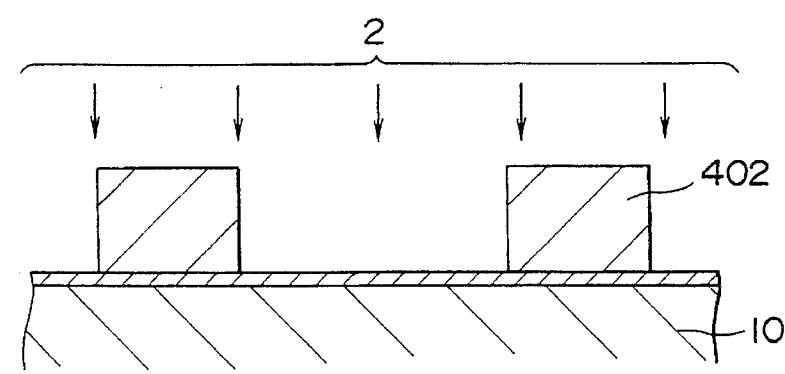

In a second process shown in FIG. 4B, ions 2 were implanted in the semiconductor substrate 10 using the oxidization preventive film 402 as a mask. The implanted amount of the ions 2 was set at about $7 \times 10^{13}$/cm².

Figure 4C:
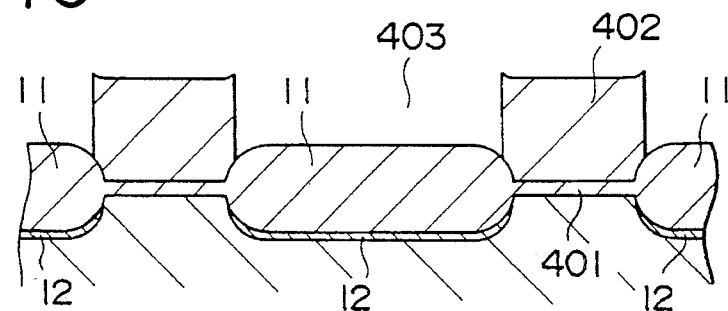

After that, as shown in FIG. 4C, the semiconductor substrate 10 was thermally treated using the oxidization preventive film 402 as a mask, to grow the pad oxide film exposed from the opening portion 403, thereby forming an element isolation film 11 made of an oxide film having a thickness of about 400 nm. Here, the ions 2 implanted in the semiconductor substrate 10 were diffused in the semiconductor substrate 10, to form a channel stop diffusion layer 12 under the element isolation film 11.

In this process, after the thermal treatment as shown in FIG. 4C, the implantation of ions 2 shown in FIG. 4C may be performed.

Figure 4D:
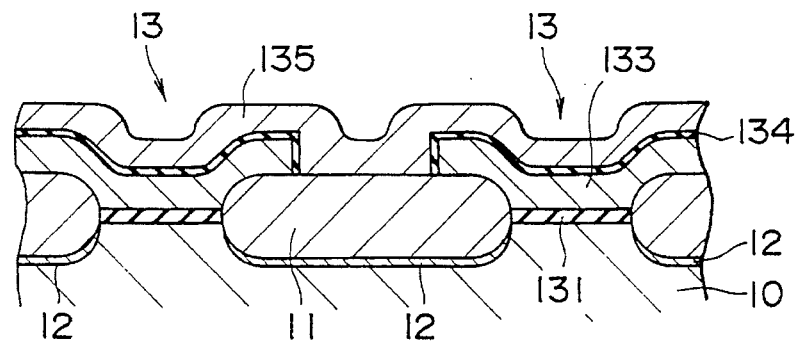
Figure 5:
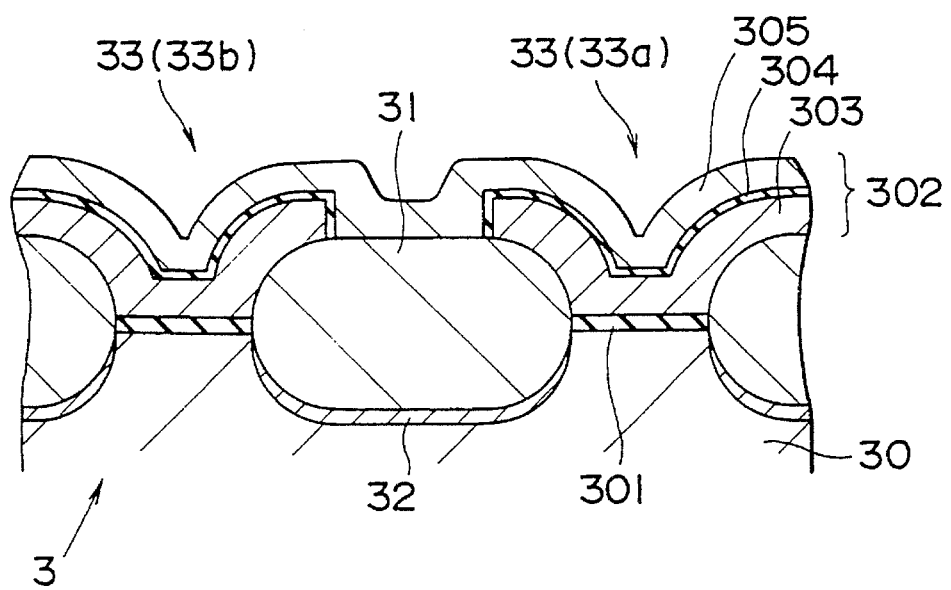
FIG. 5 is a sectional view of a prior art semiconductor device.
Figure 6:
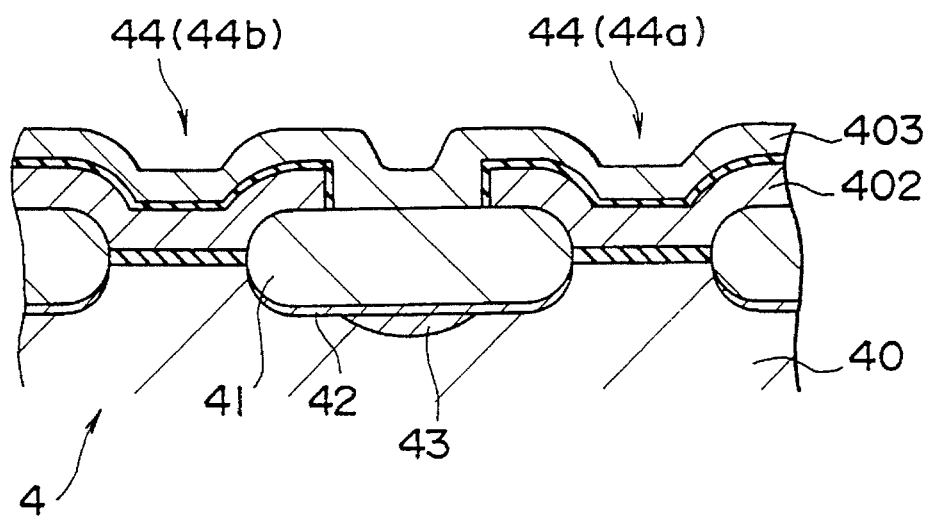
FIG. 6 is a sectional view of another prior art semiconductor device.

In a third process shown in FIG. 4D, the oxidization preventive film 402 and the pad oxide film 401 formed under the oxidization preventive film 402 were removed, and an element 13 was formed in each region in spaced-apart relation from each other by the element isolation film 11 and the channel stop diffusion layer 12.

Namely, first, a gate insulating film 131 was formed on the upper surface of a portion of the semiconductor substrate 10 from which the oxidization preventive film and the pad oxide film were removed. A floating gate 133 was formed on the gate insulating film 131 such that both the ends thereof were overlapped on the end portions of the element isolation film 11. An insulating film 134 was then formed on the exposed surface of the floating gate 133. The control gate 135 was on the insulating film 134 and on the element isolation film 11.

In the above-described method of forming the semiconductor device, the semiconductor device 1 can be formed with the channel stop diffusion layer 12 by only one step of ion implantation. Accordingly, the processes of forming the semiconductor device 1 is not complicated.

What is claimed is:

1. A method of manufacturing a semiconductor device having a plurality of elements separated by element isolation films, each of said elements comprising: source and drain regions formed on a surface portion of a semiconductor substrate in spaced-apart relation from each other to define a channel region therebetween; a gate insulating film formed on said channel region; a floating gate disposed on said gate insulating film such that both ends thereof overlap end portions of said element isolation films bounding said surface portion; an insulating film formed to cover said floating gate; and a control gate disposed on said insulating film and on said element isolation films such that said control gate is formed in pan directly on said element isolation films and in part on said insulating film covering said floating gate whose ends in turn are formed directly on said element isolating films, said method comprising:

a first process of forming an oxide layer on said substrate, forming an oxidization preventive film on said oxide layer and then forming openings in said oxidization preventative film;

a second process of forming said element isolation films on portions of said semiconductor substrate exposed by said openings in said oxidization preventative film and then also forming channel stop diffusion layers in said semiconductor substrate along respective lower surfaces of said element isolation films by implanting ions in said semiconductor substrate, said element isolation films having a thickness at locations where said control gate is formed directly thereon and said channel stop diffusion layers having an impurity concentration such that first portions of the surface of said semiconductor substrate beneath said element isolation films at said locations where said control gate is formed directly on said element isolation films invert with respect to conducting type while second portions of the surface of the substrate beneath the element isolation films at locations where said control gate is not directly formed on said element isolation films do not invert, and wherein said first portions invert and said second portion do not invert with respect to conductivity type when said floating gate is subject to a potential at least equal to about 60% of a potential applied to the control gate; and a third process forming said element on each portion of said semiconductor substrate in spaced-apart relation from each other by means of said element isolation films and said channel stop diffusion layers.

2. The method of claim 1, wherein said element isolation film thickness at said locations where said control gate is formed directly on said element isolation film is between 350 nm to 600 nm.

3. A method of manufacturing a semiconductor device according to claim 1, wherein said channel stop diffusion layer contains impurities in a concentration ranging from $3\times10^{12}/cm^2$ to $7\times10^{13}/cm^2$.

4. The method of claim 1, wherein said second process comprises forming said channel stop diffusion layers after forming said element isolation films.

5. The method of claim 1, wherein said second process comprises forming said element isolation films after forming the channel stop diffusion layers.

* * * * *